United States Patent
Chu et al.

(10) Patent No.: US 10,930,688 B2
(45) Date of Patent: Feb. 23, 2021

(54) DISPLAY SUBSTRATE, DISPLAY DEVICE, AND DISPLAY CONTROL METHOD OF DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Lulu Chu, Beijing (CN); Han Jiang, Beijing (CN); Donghan Yu, Beijing (CN); Wen Li, Beijing (CN)

(73) Assignees: BEIJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 20 days.

(21) Appl. No.: 16/145,398

(22) Filed: Sep. 28, 2018

(65) Prior Publication Data
US 2019/0252435 A1    Aug. 15, 2019

(30) Foreign Application Priority Data
Feb. 13, 2018  (CN) .......................... 201810148490.8

(51) Int. Cl.
| | | |
|---|---|---|
| *H01L 27/146* | (2006.01) | |
| *G02F 1/1335* | (2006.01) | |
| *G06F 3/041* | (2006.01) | |
| *H01L 27/12* | (2006.01) | |
| *G06F 3/042* | (2006.01) | |

(52) U.S. Cl.
CPC .. *H01L 27/14621* (2013.01); *G02F 1/133512* (2013.01); *G06F 3/042* (2013.01); *G06F 3/0412* (2013.01); *H01L 27/1214* (2013.01)

(58) Field of Classification Search
CPC ........ G06F 3/0412; G06F 3/042; G06F 3/041; G02F 1/133512; G02F 1/1335; H01L 27/1214; H01L 27/14621; H01L 27/146; H01L 27/12
See application file for complete search history.

(56) References Cited

U.S. PATENT DOCUMENTS

| | | | |
|---|---|---|---|
| 8,421,176 B2* | 4/2013 | Mimuro | ............ H01L 27/14623 257/435 |
| 9,741,184 B2* | 8/2017 | Iyer | .................... G07C 9/00309 |
| 10,013,114 B2 | 7/2018 | Wang et al. | |

(Continued)

FOREIGN PATENT DOCUMENTS

| | | |
|---|---|---|
| CN | 101105613 A | 1/2008 |
| CN | 101819340 A | 9/2010 |

(Continued)

OTHER PUBLICATIONS

First Office Action, including Search Report, for Chinese Patent Application No. 201810148490.8, dated Jun. 22, 2020, 13 pages.

(Continued)

*Primary Examiner* — Vinh T Lam
(74) *Attorney, Agent, or Firm* — Westman, Champlin & Koehler, P.A.

(57) ABSTRACT

A display substrate, a display device, and a display control method of a display device. The display substrate includes a black matrix region. At least one photosensitive circuit is in the black matrix region at a light exit side of the display substrate.

14 Claims, 2 Drawing Sheets

(56) References Cited

U.S. PATENT DOCUMENTS

| | | | |
|---|---|---|---|
| 10,580,839 B2 | 3/2020 | Ling et al. | |
| 10,620,499 B2 | 4/2020 | Liu et al. | |
| 2009/0161051 A1* | 6/2009 | Fukunaga | G06F 3/0412 349/115 |
| 2011/0260059 A1* | 10/2011 | Jiang | H01L 27/14612 250/330 |
| 2012/0268701 A1* | 10/2012 | Nemoto | G06F 3/042 349/106 |
| 2013/0155028 A1* | 6/2013 | Nakanishi | G06F 3/0425 345/175 |
| 2014/0184570 A1* | 7/2014 | Ahn | H03K 17/962 345/175 |
| 2016/0306499 A1 | 10/2016 | Wang et al. | |
| 2017/0075161 A1* | 3/2017 | Kato | G02F 1/133308 |
| 2017/0084668 A1* | 3/2017 | Wang | G06F 3/0421 |
| 2017/0309646 A1* | 10/2017 | Son | G06F 1/1643 |
| 2018/0173926 A1* | 6/2018 | Wang | G06K 9/00033 |
| 2018/0247099 A1* | 8/2018 | Liu | G06F 3/044 |
| 2019/0006441 A1* | 1/2019 | Ling | H01L 27/3234 |
| 2019/0064621 A1 | 2/2019 | Liu et al. | |
| 2019/0064953 A1* | 2/2019 | McCoy | G06F 3/042 |
| 2019/0067346 A1* | 2/2019 | Borthakur | G02B 6/12019 |
| 2019/0140006 A1* | 5/2019 | Cheng | H01L 27/14621 |
| 2019/0252435 A1* | 8/2019 | Chu | G06F 3/042 |
| 2019/0297287 A1* | 9/2019 | Oka | H01L 27/14636 |

FOREIGN PATENT DOCUMENTS

| | | |
|---|---|---|
| CN | 101819485 A | 9/2010 |
| CN | 202306503 U | 7/2012 |
| CN | 104238832 A | 12/2014 |
| CN | 105867701 A | 8/2016 |
| CN | 106298856 A | 1/2017 |
| CN | 107479281 A | 12/2017 |

OTHER PUBLICATIONS

Second Office Action, including Search Report, for Chinese Patent Application No. 201810148490.8, dated Sep. 10, 2020, 12 pages.

* cited by examiner

DISPLAY SUBSTRATE, DISPLAY DEVICE, AND DISPLAY CONTROL METHOD OF DISPLAY DEVICE

CROSS-REFERENCE TO RELATED APPLICATION

This application claims the priority benefit of Chinese Patent Application No. 2018/10148490.8 filed on Feb. 13, 2018 in the State Intellectual Property Office of China, the disclosure of which is incorporated herein by reference in entirety.

TECHNICAL FIELD

Embodiments of the present disclosure relate to the field of display technology, and in particular, to a display substrate, a display device, and a display control method of a display device.

BACKGROUND

With the increasing maturity of liquid crystal technology, Thin Film Transistor-Liquid Crystal Display (TFT-LCD) has been widely used in people's daily life.

The conventional TFT-LCD can realize display control by a touch operation, for example, a pressure sensitive material is used in the TFT-LCD, and a current is generated through a piezoelectric effect to recognize the touch operation.

SUMMARY

In a first aspect, an embodiment of the present disclosure provides a display substrate, comprising a black matrix region, wherein at least one photosensitive circuit is in the black matrix region at a light exit side of the display substrate.

As an alternative embodiment, a plurality of photosensitive circuits are in the black matrix region at the light exit side of the display substrate, and the plurality of photosensitive circuits are arranged in a matrix.

As an alternative embodiment, a plurality of photosensitive circuits are in the black matrix region at the light exit side of the display substrate, and the plurality of photosensitive circuits comprise a first group of photosensitive circuits and a second group of photosensitive circuits, the first group of photosensitive circuits intersecting with the second group of photosensitive circuits.

As an alternative embodiment, a via hole is in the black matrix region, and the photosensitive circuit is electrically connected to an exterior of the display substrate via the via hole.

In a second aspect, an embodiment of the present disclosure provides a display device, comprising the display substrate according to the above first aspect.

As an alternative embodiment, the display substrate is a color filter substrate; and wherein the color filter substrate comprises a protective layer covering the black matrix region, an opening is in the protective layer, a metal contact pad is at the opening, and the metal contact pad is electrically connected to the photosensitive circuit via a via hole in the black matrix region.

As an alternative embodiment, the display device further comprises an array substrate opposite to the color filter substrate, and a common electrode layer is on the array substrate; and wherein a photo spacer is between the color filter substrate and the array substrate, and wherein one end of the photo spacer is electrically connected to the metal contact pad, and the other end of the photo spacer is electrically connected to the common electrode layer.

As an alternative embodiment, the photo spacer comprises anisotropic conductive micro-particles.

As an alternative embodiment, the display device is a touch display device.

As an alternative embodiment, a plurality of pixels are on the display substrate, each of the pixels comprising a plurality of sub-pixels, and portions constituting the black matrix region are between adjacent sub-pixels.

As an alternative embodiment, the photosensitive circuit comprises a photoresistor string.

As an alternative embodiment, the display device further comprises a passivation layer and/or a gate insulation layer.

In a third aspect, an embodiment of the present disclosure provides a display control method of the display device according to the above second aspect, the method comprising:

detecting whether a current of the photosensitive circuit in the black matrix region of the display device changes in real time;

in response to change of the detected current, determining a position of an illumination point in the display device according to a position of the black matrix region where the current changes;

implementing a remote non-touch display control to the display device according to the position of the illumination point.

As an alternative embodiment, the display device further has a touch function, and a remote non-touch function and the touch function are achieved in a time-sharing control manner.

As an alternative embodiment, before detecting whether the current of the photosensitive circuit in the black matrix region of the display device changes or not in real time, the method further comprises:

triggering the remote non-touch function of the display device.

As an alternative embodiment, in response to the display device achieving the touch function, a common electrode layer receives a touch control signal; and in response to the display device achieving the remote non-touch function, the common electrode layer receives a remote non-touch control signal.

BRIEF DESCRIPTION OF THE DRAWINGS

Other features, objects, and advantages of the present disclosure will become more apparent from the detailed description of the exemplary embodiments with reference to the accompanying drawings.

DETAILED DESCRIPTION OF EMBODIMENTS

Figure 1:
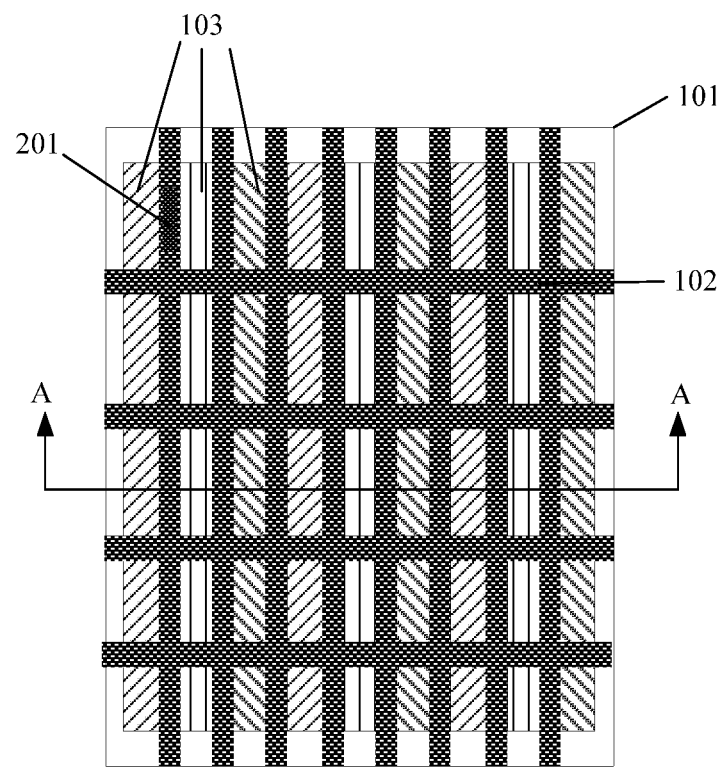
FIG. 1 is a schematic structural top view of a display substrate according to an embodiment of the present disclosure.

The present disclosure will be further described in detail below with reference to the accompanying drawings and the embodiments. It is to be understood that the specific embodiments described herein are merely illustrative of the present disclosure and are not intended to limit the present disclosure. It should also be noted that, for the convenience of description, only the parts related to the present disclosure are shown in the drawings.

It should be noted that the embodiments and the features in the embodiments of the present disclosure may be combined with each other unless they are contradicted.

The present disclosure will be described in detail below with reference to the accompanying drawings in combination with the embodiments.

The thickness, size and shape of the various components in the drawings do not represent the true scales, and they are merely intended to illustrate the contents of the present disclosure.

At present, it cannot realize a remote non-touch display control of TFT-LCD. In view of this, the embodiments of the present disclosure provide a display substrate, a display panel, a display control method of a display panel, and a display device, which can realize the remote non-touch display control of the TFT-LCD. An embodiment of the present disclosure provides a display substrate 101. FIG. 1 is a schematic structural top view of the display substrate 101. A black matrix (BM) region 102 is formed on the display substrate 101, and photosensitive circuits 201 are provided in the black matrix region 102.

The photosensitive circuit is sensitive to light, and its resistance will change when light illuminates it. An optical remote control of the display device can be realized by using the photosensitive circuit, that is, the display may be controlled in a non-touch manner. The working principle is as follows: when the light (for example, infrared light) illuminates the photosensitive circuit in the black matrix region, a resistance value of the photosensitive circuit is reduced, thereby causing a change of current, and then the illumination position of the light can be recognized by detecting the change of current, so as to implement an optical remote control function.

Specifically, the plurality of photosensitive circuits 201 are provided in the black matrix region 102 at a light exit side of the display substrate 101, and the plurality of photosensitive circuits 201 are arranged in a matrix. In FIG. 1, only one photosensitive circuit 201 is shown to simply the drawing, but it should be noted that there are several photosensitive circuits 201 in each row of the black matrix region 102, and there are several photosensitive circuits 201 in each column of the black matrix region 102. Optionally, the adjacent photosensitive circuits 201 are independent from each other and are not connected to each other.

Due to the plurality of photosensitive circuits 201 arranged in a matrix, the change of current in one photosensitive circuit 201 may be associated with one specific position. Thus, it can easily determine the illumination position of light.

Figure 4:
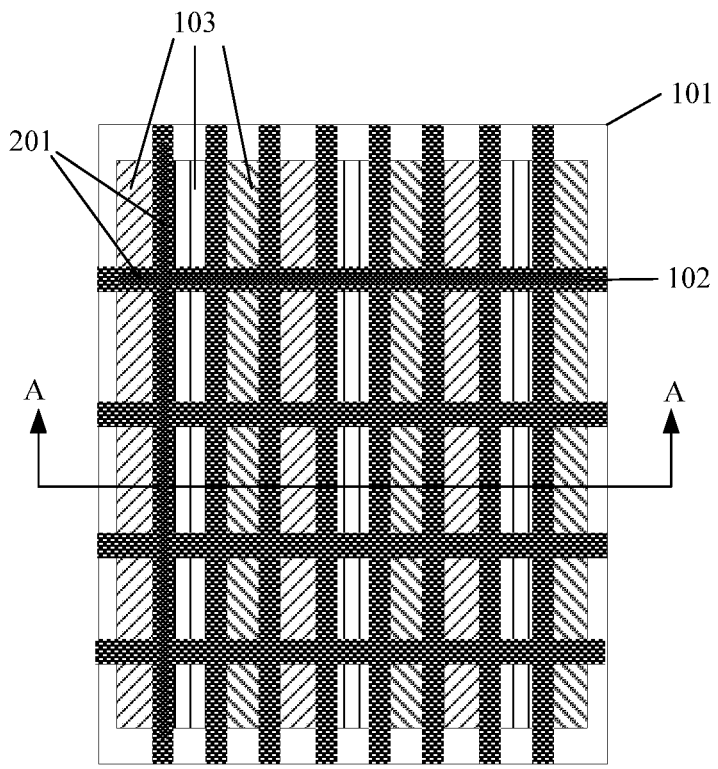
FIG. 4 is a schematic structural top view of a display substrate according to another embodiment of the present disclosure.

As an alternative, the plurality of photosensitive circuits 201 are divided into two groups of photosensitive circuits 201, see FIG. 4, the first group of photosensitive circuits 201 includes several photosensitive circuits 201 arranged in a first direction (for example, a horizontal direction) in parallel to each other, and the second group of photosensitive circuits 201 includes several photosensitive circuits 201 arranged in a second direction (for example, a vertical direction) in parallel to each other. The first direction is perpendicular to the second direction. In this embodiment, the photosensitive circuits 201 in the first group and the second group are strip-shaped, and the photosensitive circuits 201 in the first group intersect with the photosensitive circuits 201 in the second group. Furthermore, the photosensitive circuits 201 in the first group are insulated from the photosensitive circuits 201 in the second group at the intersecting points thereof, so as to avoid crosstalk of electrical signals. In FIG. 4, only one horizontal photosensitive circuit 201 and one vertical photosensitive circuit 201 are shown to simply the drawing, but it should be noted that there are several photosensitive circuits 201 in the first group, and there are several photosensitive circuits 201 in the second group. In particular, the photosensitive circuits 201 correspond to respective branches of the black matrix region 102.

As an example, a surface of the photosensitive circuit 201 is flush with a surface of the black matrix region 102. Specifically, the upper surface of the photosensitive circuit 201 is flush with the surface of the black matrix region 102, thus the photosensitive circuit 201 is embedded in the black matrix region 102.

Further, via holes are provided in the black matrix region, and the photosensitive circuits are electrically connected to an exterior of the display substrate via the via holes. For example, in the embodiment shown in FIG. 1, via holes 1021 are provided for respective photosensitive circuits 201 in one-to-one correspondence, and each photosensitive circuit 201 is electrically connected to the common electrode described below, the specific connecting manner thereof will be described below. The embodiment shown in FIG. 4 is similar to FIG. 1 in terms of the arrangement of the via holes, except that the number of the via holes in FIG. 4 is less than that in FIG. 1 as the number of the photosensitive circuits 201 in FIG. 4 is less than that in FIG. 1.

The photosensitive circuit 201 can be constructed in a form of photoresistor string.

Figure 2:
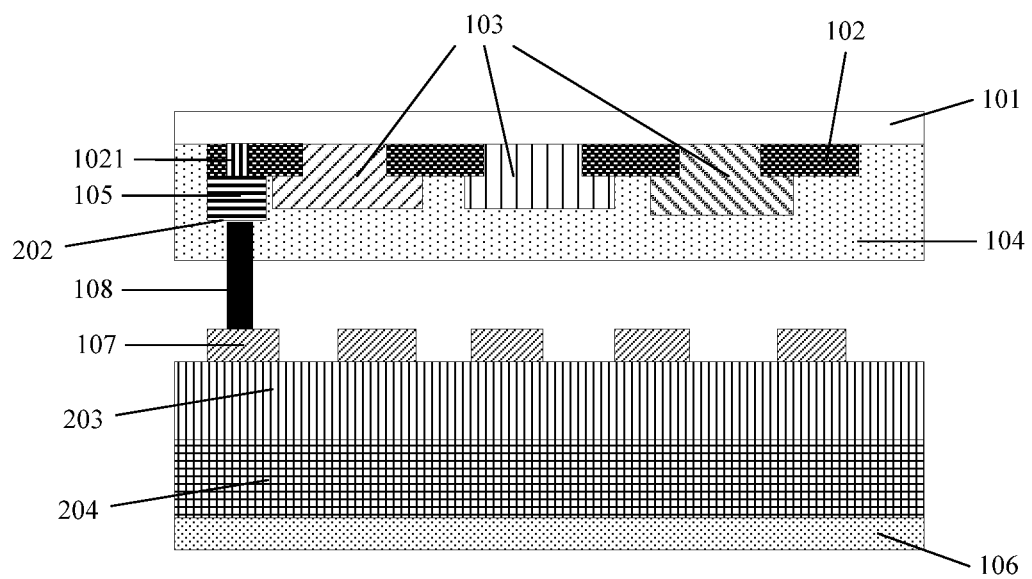
FIG. 2 is a cross-sectional structural view of a display panel taken along line A-A of FIG. 1 according to an embodiment of the present disclosure.

A plurality of pixels are formed on the display substrate 101. Each of the pixels includes a plurality of sub-pixels 103, and the black matrix region 102 is located among the sub-pixels 103, that is, portions constituting the black matrix region 102 are located between adjacent sub-pixels 103. It should be noted that that, the fact that the portions constituting the black matrix region 102 are located between the adjacent sub-pixels 103 should be broadly interpreted, that is, the portions may be completely located between the adjacent sub-pixels 103 without being overlapped with the adjacent sub-pixels 103, or may also be partially located between the adjacent sub-pixels 103 such that the portions have an area overlapped with the adjacent sub-pixels 103, as shown in FIG. 2.

As an example, the photosensitive circuit 201 is disposed on a surface of the black matrix region 102 away from a display side of the display panel, and external light can illuminate the photosensitive circuit 201. Since the black matrix region 102 is disposed among the sub-pixels 103, the photosensitive circuit thereon is not affected by the light emitted from the display panel.

Each of the sub-pixels 103 may include a red sub-pixel, a blue sub-pixel, and a green sub-pixel.

As an alternative, the display substrate may be a color filter (CF) substrate or an array substrate.

Based on the same concept, an embodiment of the present disclosure further provides a display panel, as shown in FIG. 2, including the above display substrate 101.

As an alternative, when the display substrate 101 is a color filter substrate, the color filter substrate may include a protective layer (or called as over coat, OC for short) 104, an opening 202 is provided in the protective layer 104, a metal contact pad 105 is provided at the opening 202, and the metal contact pad 105 is electrically connected to the photosensitive circuit 201 via a via hole provided in the black matrix region 102. Herein, the black matrix region 102 may be not electrically conductive, thus a via hole may be provided in the black matrix region 102 so that the metal contact pad 105 can be electrically connected to the photosensitive circuit 201 via the via hole. It should be noted that the metal contact pad 105 may be electrically connected to the photosensitive circuit 201 by other manners.

The black matrix region 102 may be made from a known material, such as metal film (for example, metallic oxide) or resin film. In an embodiment, the photosensitive circuit 201 is formed on the black matrix region 102 by Plasma Enhanced Chemical Vapor Deposition (PECVD) and etching processes, similar to the processes for manufacturing TFTs.

As an alternative, the display panel may further include an array substrate 106 disposed opposite to the color filter substrate 101, the array substrate 106 being formed with a common (COM) electrode layer 107; and a photo spacer 108 is provided between the color filter substrate 101 and the array substrate 106. One end of the photo spacer 108 is electrically connected to the metal contact pad 105, and the other end of the photo spacer 108 is electrically connected to the common electrode layer 107.

Since the array substrate 106 has a TFT structure, it can also be referred to as a TFT substrate.

As an example, the photo spacer 108 may be filled with anisotropic conductive micro-particles. The conductive micro-particles are electrically conductive in a direction perpendicular to the color filter substrate 101 and the array substrate 106.

By means of providing an opening in the protective layer of the color filter substrate and providing a metal contact pad at the opening, the metal contact pad and the black matrix region are electrically connected to each other so that the photosensitive circuit in the black matrix region may be electrically connected to the external. A kind of anisotropic conductive micro-particles are added into the photo spacer, and the conductive micro-particles are electrically conductive in the direction perpendicular to the color filter substrate and the array substrate, and one end of the photo spacer contacts the common electrode layer of the TFT substrate, and the other end contacts the metal contact pad of the color filter substrate. In this way, an electrical signal of the photosensitive circuit can be led to an IC circuit.

According to the display panel provided by the embodiments of the present disclosure, the display function and the remote non-contact control function may be implemented by a time-sharing control manner. When implementing the display function, the common electrode layer works in response to a normal display common signal; and when implementing the remote non-contact control function, the common electrode layer works in response to an optical control signal. In addition, the display panel according to the embodiments of the present disclosure may also be a touch display panel, that is, it may have a touch function as well as the remote non-touch function. In this case, the display panel can implement the touch function and the remote non-touch function in a time-sharing control manner. When the display panel implements the touch function, the common electrode layer 107 on the array substrate 106 in the display panel receives a touch control signal; while when the display panel implements the remote non-touch function, the common electrode layer 107 on the array substrate 106 in the display panel receives a remote non-touch control signal, specifically, during this process, the common electrode provides a signal to the photosensitive circuit, and then the current in the photosensitive circuit may be led out via a signal line, so as to facilitate the detection.

It should be noted that the passivation layer 203 and the gate insulation layer 204 in FIG. 2 are of structures which are the same as the display panel in the related art, and thus they will not be described herein.

Based on the same concept, an embodiment of the present disclosure further provides a display device including the above display panel. Other essential components of the display device are well understood by those skilled in the art, and thus they will not be described herein.

Figure 3:
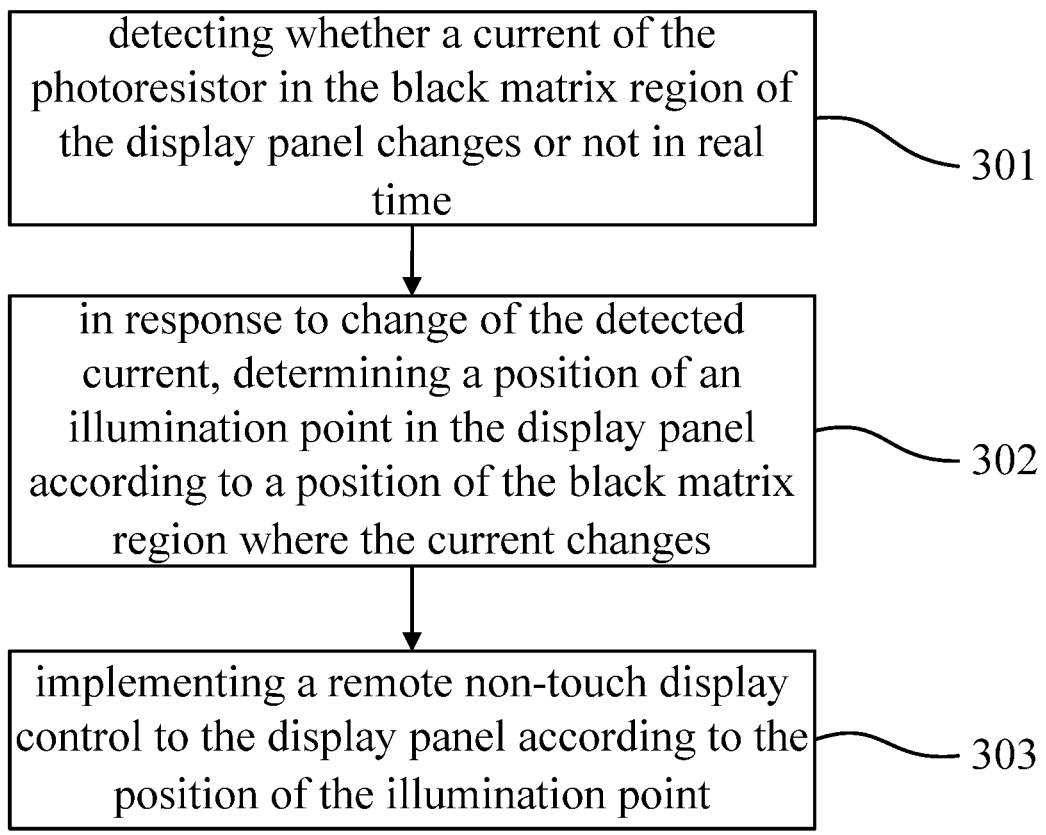
FIG. 3 is a schematic flowchart of a display control method of a display panel according to an embodiment of the present disclosure.

Based on the same concept, an embodiment of the present disclosure further provides a display control method of the above display panel. As shown in FIG. 3, the method includes the following steps:

Step 301: detecting whether a current of the photosensitive circuit in the black matrix region of the display panel changes or not in real time.

When the display panel is illuminated by the light, the resistance value of the photosensitive circuit in the black matrix region where the illumination point is located is reduced, and then the current is increased. Therefore, it can be determined whether there is light to illuminate the display panel in real time as long as it is determined whether the current of the photosensitive circuit in the black matrix region of the display panel changes or not in real time.

In addition, the light involved in the embodiments of the present disclosure may be a special light, for example, an infrared light.

Step 302: in response to change of the detected current, determining a position of an illumination point in the display panel according to a position of the black matrix region where the current changes;

Step 303: implementing a remote non-touch display control to the display panel according to the position of the illumination point.

In the above solutions according to the embodiments of the present disclosure, a photosensitive circuit is provided in the black matrix region formed on the color filter substrate of the display panel. When the display panel is illuminated by the light, the illumination position of the light is recognized by detecting the change of the current of the photosensitive circuit, thereby achieving the remote non-touch control of the display panel.

In addition, as an example, when the display panel is a touch display panel, the display panel has a touch function in addition to the remote non-touch function. In this case, the display panel can implement the touch function and the remote non-touch function by the time-sharing control manner, that is, the remote non-touch function is turned off when the touch function is turned on, and the touch function is turned off when the remote non-touch function is turned on.

In this case, before the step 301 of detecting whether the current of the photosensitive circuit in the black matrix region of the display panel changes or not in real time, the method may further include:

triggering the remote non-touch function of the display panel.

In summary, in the display substrate, the display panel, the display control method of the display panel, and the display device according to the embodiments of the present disclosure, a photosensitive circuit is provided in the black matrix region formed on the display substrate of the display panel. When the display panel is illuminated by the light, the illumination position of the light is recognized by detecting the change of the current of the photosensitive circuit, thereby achieving the remote non-touch control of the display panel.

The above description only refers to exemplified embodiments of the present disclosure and the description of the principles of the applied technology. It should be understood by those skilled in the art that the scope of the present disclosure is not limited to the solutions covering the specific combination of the above technical features, but should include other technical solutions formed by any combination of the above technical features and their equivalent features without departing from the concept of the present disclosure, for example, the technical solutions formed by the replacement with the technical features having similar functions disclosed in the present disclosure.

What is claimed is:

1. A display substrate, comprising a black matrix region, wherein a plurality of photosensitive circuits for realizing an optical remote control in a non-touch manner are in the black matrix region at a light exit side of the display substrate, the photosensitive circuits are directly disposed on a surface of the black matrix region close to the light exit side of the display substrate so that external light can illuminate the photosensitive circuit,
   wherein the plurality of photosensitive circuits comprise a first group of photosensitive circuits and a second group of photosensitive circuits, the first group of photosensitive circuits intersecting with the second group of photosensitive circuits,
   wherein a via hole is in the black matrix region, and one photosensitive circuit is electrically connected to an exterior of the display substrate via the via hole.

2. The display substrate according to claim 1, wherein the plurality of photosensitive circuits are arranged in a matrix.

3. A display device, comprising a color filter substrate and an array substrate opposite to the color filter substrate,
   wherein the color filter substrate comprises a black matrix region, wherein a plurality of photosensitive circuits for realizing an optical remote control in a non-touch manner are in the black matrix region at a light exit side of the color filter substrate, the photosensitive circuits are directly disposed on a surface of the black matrix region close to the light exit side of the color filter substrate so that external light can illuminate the photosensitive circuits,
   wherein the plurality of photosensitive circuits comprise a first group of photosensitive circuits and a second group of photosensitive circuits, the first group of photosensitive circuits intersecting with the second group of photosensitive circuits,
   wherein a via hole is in the black matrix region, and one photosensitive circuit is electrically connected to an exterior of the color filter substrate via the via hole,
   wherein the plurality of photosensitive circuits are located at a side of the black matrix region away from the array substrate, and the plurality of photosensitive circuits are in direct contact with the black matrix region.

4. The display device according to claim 3, wherein the color filter substrate comprises a protective layer covering the black matrix region, an opening is in the protective layer, a metal contact pad is at the opening, and the metal contact pad is electrically connected to one photosensitive circuit via a via hole in the black matrix region.

5. The display device according to claim 4, wherein a common electrode layer is on the array substrate; and
   wherein a photo spacer is between the color filter substrate and the array substrate, and wherein one end of the photo spacer is electrically connected to the metal contact pad, and the other end of the photo spacer is electrically connected to the common electrode layer.

6. The display device according to claim 5, wherein the photo spacer comprises anisotropic conductive micro-particles.

7. The display device according to claim 5, wherein the display device is a touch display device.

8. The display device according to claim 3, wherein a plurality of pixels are on the color filter substrate, each of the pixels comprising a plurality of sub-pixels, and portions constituting the black matrix region are between adjacent sub-pixels.

9. The display device according to claim 3, wherein each photosensitive circuit comprises a photoresistor string.

10. The display device according to claim 3, further comprising a passivation layer and/or a gate insulation layer.

11. A display control method of the display device according to claim 3, the method comprising:
   detecting whether a current of one photosensitive circuit in the black matrix region of the display device changes in real time;
   in response to change of the detected current, determining a position of an illumination point in the display device according to a position of the black matrix region where the current changes;
   implementing a remote non-touch display control to the display device according to the position of the illumination point.

12. The display control method according to claim 11, wherein the display device further has a touch function, and a remote non-touch function and the touch function are achieved in a time-sharing control manner.

13. The display control method according to claim 12, wherein, before detecting whether the current of the photosensitive circuit in the black matrix region of the display device changes or not in real time, the method further comprises:
   triggering the remote non-touch function of the display device.

14. The display control method according to claim 12, wherein,
   in response to the display device achieving the touch function, a common electrode layer receives a touch control signal; and
   in response to the display device achieving the remote non-touch function, the common electrode layer receives a remote non-touch control signal.

* * * * *